US009287418B2

(12) United States Patent
Nirantare et al.

(10) Patent No.: US 9,287,418 B2
(45) Date of Patent: Mar. 15, 2016

(54) SYSTEM AND METHOD FOR CONNECTION OF PHOTOVOLTAIC ARRAYS IN SERIES AND PARALLEL ARRANGEMENTS (75) Inventors: Prasanna S. Nirantare, Maharashira (IN); Vijay Bhavaraju, Germantown, WI (US); Tiefu Zhao, Milwaukee, WI (US); Jun Xu, Shanghai (CN); Christopher Scott Thompson, Kingston, RI (US)

(73) Assignee: Eaton Corporation, Cleveland, OH (US)

( * ) Notice: Subject to any disclaimer, the term of this patent is extended or adjusted under 35 U.S.C. 154(b) by 814 days.

(21) Appl. No.: 13/538,473

(22) Filed: Jun. 29, 2012

(65) Prior Publication Data

US 2014/0001864 A1    Jan. 2, 2014

(51) Int. Cl.
*H02J 1/00* (2006.01)
*H02J 3/00* (2006.01)
*H01L 31/02* (2006.01)
(Continued)

(52) U.S. Cl.
CPC ............. *H01L 31/02021* (2013.01); *H02J 1/10* (2013.01); *H01L 31/05* (2013.01); *Y02E 10/50* (2013.01); *Y10T 307/653* (2015.04)

(58) Field of Classification Search
CPC ............. H02J 7/0024; H02J 7/35; H02J 3/38; H02J 1/10; F41B 6/00; Y02T 10/7055; G05F 1/62; G01R 31/02; H02M 7/81; H02M 1/12; H02M 7/42; H02M 7/48
USPC ............ 307/71, 82, 64, 66, 80; 136/246, 244, 136/245, 243; 361/42
See application file for complete search history.

(56) References Cited

U.S. PATENT DOCUMENTS

| 8,816,535 B2 * | 8/2014 | Adest ...................... H02J 1/102 307/43 |
| 2010/0132758 A1 | 6/2010 | Gilmore |

(Continued)

FOREIGN PATENT DOCUMENTS

| EP | 2461456 A1 | 6/2012 | |
| WO | 2012/038828 * | 9/2010 | .............. H01L 31/05 |
| WO | 2012038828 A1 | 3/2012 | |

OTHER PUBLICATIONS

Chaaban et al., "Adaptive Photovoltaic System," IECON 2010—36th Annual Conference on IEEE Industrial Electronics Society, IEEE, Piscataway, NJ, USA, Nov. 7, 2010, pp. 3192-3197.

*Primary Examiner* — Rexford Barnie
*Assistant Examiner* — Jagdeep Dhillon
(74) *Attorney, Agent, or Firm* — Ziolkowski Patent Solutions Group, SC (57) ABSTRACT A system and method for selectively connecting photovoltaic (PV) arrays of a PV power system in series and parallel arrangements is disclosed. A DC-to-AC power inverter in the PV power system is electrically coupled to a plurality of PV arrays to receive a DC output therefrom and invert the DC output to an AC output, with the DC-to-AC power inverter including a DC link that receives the DC output from the plurality of PV arrays. A contactor arrangement is positioned between the plurality of PV arrays and the DC-to-AC power inverter, with the contactor arrangement including a plurality of contactors that are switchable between an on state and an off state to selectively connect the plurality of PV arrays to the DC-to-AC power inverter in a specified arrangement, so as to control a level of DC voltage received by the DC-to-AC power inverter from the plurality of PV arrays.

20 Claims, 8 Drawing Sheets (51) Int. Cl.
*H02J 1/10* (2006.01)
*H01L 31/05* (2014.01)

(56) References Cited

U.S. PATENT DOCUMENTS

| | | |
|---|---|---|
| 2010/0142227 A1 | 6/2010 | Min et al. |
| 2010/0250018 A1 | 9/2010 | Hauf et al. |
| 2010/0253151 A1 | 10/2010 | Gerhardinger et al. |
| 2011/0232714 A1 | 9/2011 | Bhavaraju et al. |
| 2012/0074787 A1* | 3/2012 | West .................. H02H 7/20 307/80 |
| 2012/0174961 A1* | 7/2012 | Larson .............. H01L 31/02021 136/246 |
| 2013/0181531 A1* | 7/2013 | Deboy .................... H02J 3/385 307/82 |
| 2013/0307556 A1* | 11/2013 | Ledenev .............. G01R 31/025 324/509 |

* cited by examiner

SYSTEM AND METHOD FOR CONNECTION OF PHOTOVOLTAIC ARRAYS IN SERIES AND PARALLEL ARRANGEMENTS

BACKGROUND OF THE INVENTION

The present invention relates generally to photovoltaic (PV) power systems and, more particularly, to a PV array that incorporates a set of contactors that are selectively operated in order to provide an increased working voltage for a PV inverter in the PV power system without the use of DC-DC converters.

PV power systems are power systems that employ a plurality of solar modules to convert sunlight into electricity. PV systems include multiple components, including photovoltaic modules, mechanical and electrical connections and mountings, and means of regulating or modifying the electrical output. One common arrangement in PV systems is for several PV modules to be connected in series to form a PV string, with multiple PV strings in a PV system then being combined in parallel to aggregate the current in a PV array. The output of multiple PV arrays can then be combined by way of a combiner box that aggregates the DC power from the PV arrays and provides a connection point (i.e., a common bus) for the PV arrays.

In operation, PV modules generate direct current (DC) power, with the level of DC current being dependent on solar irradiation and the level of DC voltage dependent on temperature. When alternating current (AC) power is desired, an inverter is used to convert the DC energy from the array into AC energy, such as AC energy suitable for transfer to a power grid. Typical PV inverters employ two stages for power processing. The first stage of the PV inverter is configured to regulate a widely varying DC voltage from an array of PV cells, so as to provide a constant DC voltage output. The second stage of the PV inverter is configured to convert the constant DC voltage to AC current. Often, the first stage includes a boost converter, and the second stage includes a single-phase or three-phase inverter system.

For converting the varying DC voltage of a PV array to the fixed frequency AC voltage of the power grid, many PV inverters employ a two-stage conversion power circuit that uses a DC link as an intermediate energy storage step, which means that the converter first converts the varying PV array voltage to a stable DC voltage. The PV DC-to-AC inverter then subsequently converts the stable voltage into an AC current that can be injected into the grid. Alternatively, PV inverters can instead employ a single stage conversion power circuit in which a transformer is employed to boost the AC voltage.

With respect to typical two stage PV inverters, one drawback is that such inverters are inherently less efficient and more costly due to the second stage. That is, the efficiency of the two-stage inverter is a multiple of the individual stage efficiencies, with each stage typically causing one-half of the system losses. It would thus be beneficial to eliminate one stage of the PV inverter, i.e., eliminate the DC-DC converter, so as to increase efficiency of the inverter. However, it is recognized that elimination of the DC-DC converter would result in the inverter having a smaller DC operating window, as single stage PV inverters are recognized as having a smaller DC voltage operating window. Thus, in eliminating the DC-DC converter, a mechanism is needed that minimizes variation of the output of the PV array(s) to the PV inverter.

Another recognized drawback with existing PV array and PV inverter arrangements is that the DC power and voltage generated by the PV array groups can widely vary, as the amount of DC power/voltage generated thereby is dependent on the temperature at which PV arrays operate and the amount of solar irradiation received by the PV arrays. Accordingly, the PV inverter may not always be operating at an optimal working voltage if the amount of DC voltage received from the PV array is less than the optimal working voltage level. This can occur during periods of cloudy weather or early/late in the day, as the level of solar irradiation received by the PV array may not be adequate at these times. It would be beneficial if the variation of the DC voltage received by the PV inverter from the PV array could be minimized and that sufficient DC voltage could be provided from the PV array to allow the PV inverter to operate at or close to an optimal working voltage, such that the PV inverter operates at a higher or peak efficiency.

It would therefore be desirable to provide a PV array to a PV inverter that employs a single stage topology, as compared to a traditional two-stage PV inverter, so as to provide an increased working voltage and minimize system losses, while still providing the larger DC operating window of a two-stage design. It would also be desirable to provide a PV inverter, and technique for controlling thereof, that minimizes variation of the output of the PV array(s) to the PV inverter and that ensures the PV inverter is always operating at peak efficiency.

BRIEF DESCRIPTION OF THE INVENTION

The present invention provides a system and method for selectively connecting PV arrays in a PV power system in series and parallel arrangements, so as to eliminate the need for a DC-DC conversion in a PV inverter and improve efficiency in the PV power system.

In accordance with one aspect of the present invention, a PV power system includes a plurality of PV arrays each configured to generate a DC output from received solar irradiation and a DC-to-AC power inverter electrically coupled to the plurality of PV arrays to receive the DC output therefrom and invert the DC output to an AC output, the DC-to-AC power inverter including a DC link that receives the DC output from the plurality of PV arrays. The PV power system also includes a contactor arrangement positioned between the plurality of PV arrays and the DC-to-AC power inverter, the contactor arrangement including a plurality of contactors that are switchable between an on state and an off state to selectively connect the plurality of PV arrays to the DC-to-AC power inverter in a specified arrangement, so as to control a level of DC voltage received by the DC-to-AC power inverter from the plurality of PV arrays.

In accordance with another aspect of the invention, a method for controlling the DC voltage provided to a PV inverter from a plurality of PV arrays is provided. The method includes the steps of measuring a DC voltage on a DC link of the PV inverter or from each of a plurality of PV arrays, comparing the DC voltage to one or more voltage thresholds of the PV inverter, and controlling an operating state of each of a plurality of contactors in a contactor arrangement based on the comparison of the DC voltage to the one or more voltage thresholds of the PV inverter, with the contactor arrangement being connected between the PV inverter and the plurality of PV arrays to control a level of DC voltage received by the PV inverter from the plurality of PV arrays. In controlling the operating state of each of a plurality of contactors, the method further includes the steps of operating each of the plurality of contactors in an on state or an off state so as to selectively connect the plurality of PV arrays to the PV inverter in a determined arrangement, the determined arrangement comprising a determined number of PV arrays in a series arrangement and a determined number of PV arrays in a parallel arrangement.

In accordance with yet another aspect of the invention, a PV power system includes a plurality of PV arrays each configured to generate a DC output from received solar irradiation and a PV inverter electrically coupled to the plurality of PV arrays to receive the DC output therefrom and invert the DC output to an AC output usable by a load connected to the PV inverter, with the PV inverter including a DC link that operates at a variable DC link voltage that is determined by the PV inverter according to a global maximum power point tracking (MPPT) algorithm. The PV power system also includes a contactor arrangement positioned between the plurality of PV arrays and the PV power inverter that includes a plurality of contactors that are switchable between an on state and an off state to selectively connect the plurality of PV arrays to the DC link and so as to control a level of DC voltage received by the PV inverter from the plurality of PV arrays. The PV power system further includes a controller in operable connection with the contactor arrangement, the controller being programmed to control operation of the contactor arrangement so as to cause the DC output provided from the plurality of PV arrays to the PV inverter to exceed a minimum PV inverter operation voltage value.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

The embodiments of the invention set forth herein relate to a system and method for selectively connecting PV arrays in a PV power system in series and parallel arrangements, so as to eliminate the need for a DC-DC conversion in a PV inverter and improve efficiency in the PV power system.

Figure 1:
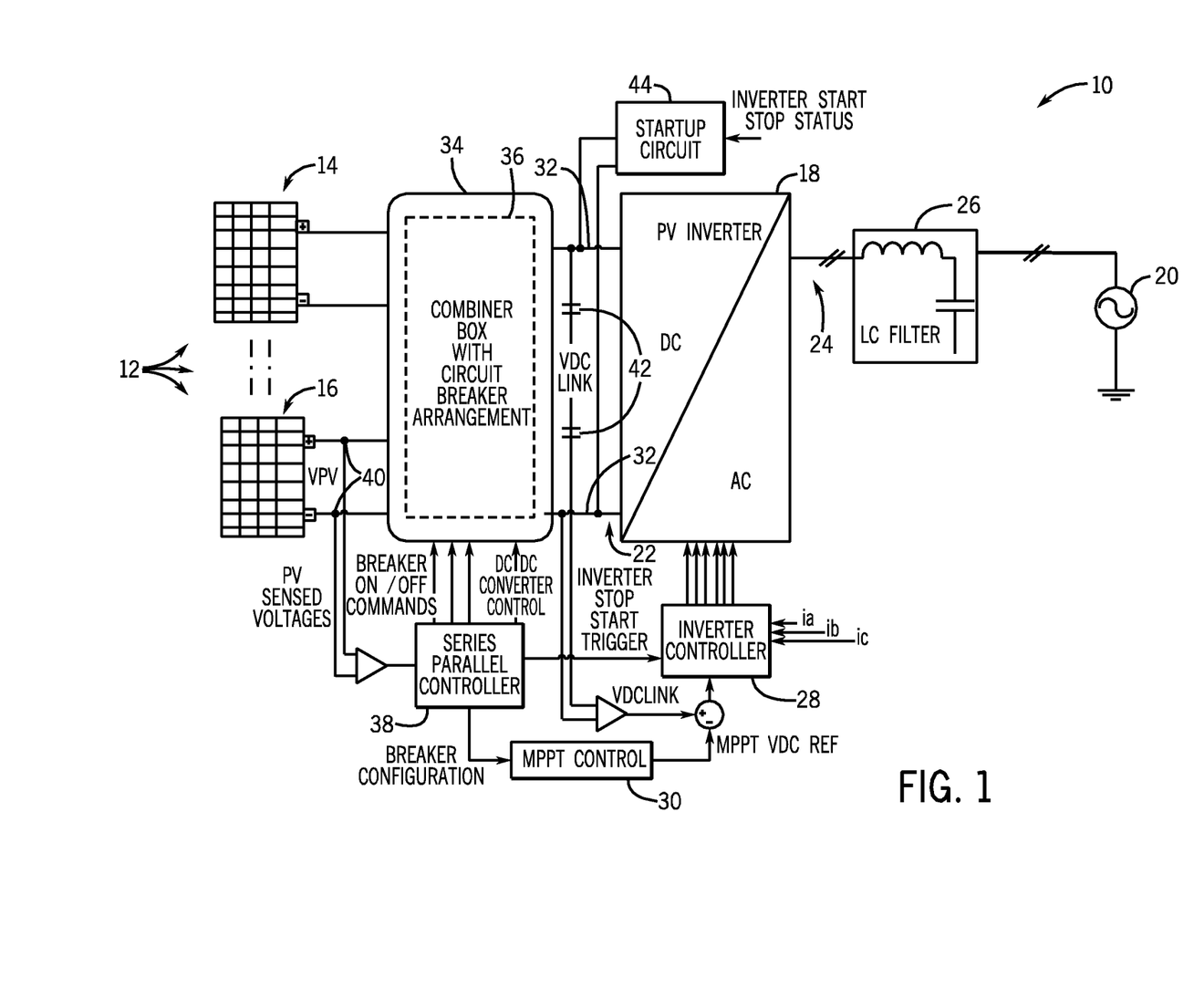
FIG. 1 is a block schematic diagram of a PV power system incorporating a selectively modifiable contactor arrangement according to an embodiment of the present invention.

Referring to FIG. 1, a photovoltaic (PV) power system 10 is illustrated according to an embodiment of the invention. The PV power system 10 includes a plurality of PV arrays 12, with each of the PV arrays 12 being configured to generate a DC power responsive to received solar irradiation. Each of the PV arrays 12 is composed of a plurality of parallelly connected PV strings (not shown), with each of the PV strings including a plurality of modules (not shown) therein that are connected in series to generate a DC power. While only a first PV array 14 and a second PV array 16 are shown in FIG. 1, it is recognized that the number of PV arrays in PV power system 10 can vary, with two, three, four or more PV arrays 12 (e.g., eight PV arrays) being included in the PV power system 10, for example.

Also included in PV power system 10 is a PV inverter 18 (i.e., DC-to-AC power inverter) configured to convert a varying DC voltage received from PV arrays 12 to a fixed frequency AC current (i.e., a DC-to-AC conversion) for use by an AC load, such as a power grid 20. The PV inverter 18 includes an input 22 electrically coupled to the PV array groups 12 to receive a DC voltage therefrom, a plurality of switches (not shown) that convert the DC power to an AC power, and an output 24 to transfer the AC power through a filter 26 (e.g., LC filter, LCL filter, etc.) and to the AC power grid 20. An inverter controller 28 associated with PV inverter 18 functions to control switching of the plurality of switches in the PV inverter 18 in order to output a desired AC power.

According to an exemplary embodiment of the invention, PV inverter 18 is configured to perform a system level (i.e., "global") maximum power point tracking (MPPT) in PV power system 10 according to an array power algorithm implemented thereby, indicated at 30. In performing such a global MPPT, PV inverter 18 functions to get the maximum possible power from the PV array 12 by dynamic loading of the PV array to obtain maximum power for any given environmental conditions. One embodiment of the PV inverter 18 functions to control the voltage on the DC link 32, $V_{DC}$, according to the MPPT instituted by the array power algorithm based on the desired or required power to be output from the PV power system 10, and essentially defines the current that the inverter 18 should draw from the PV arrays 12 in order to get the maximum possible power (since power equals voltage times current) for the PV system 10.

As shown in FIG. 1, according to an exemplary embodiment of the invention, the PV arrays 12 are electrically coupled to PV inverter 18 by way of a combiner box 34 positioned therebetween. The combiner box 34 includes therein a contactor arrangement or circuit breaker arrangement 36 that functions to selectively connect the PV arrays 12 to the PV inverter 18 in a desired/specified arrangement. While the contactor/circuit arrangement 36 is referred to hereafter as a contactor arrangement, it is recognized that the arrangement can include any of a number of suitable switching devices therein (not just contactors), including IGBTs, SCRs, circuit breakers, and/or relays, for example, and thus the term "contactor" as used here below is meant to encompass each of the above identified switching devices. The contactor arrangement 36 is controlled to selectively connect a desired number of the PV arrays 12 in a specified series arrangement or parallel arrangement, so as to control a level of DC voltage received by DC link 32 of the PV inverter 18 from the PV arrays 12. While the contactor arrangement 36 is shown in FIG. 1 as being incorporated into combiner box 34, it is recognized that the contactor arrangement 36 may be integrated into PV inverter 18, according to another embodiment of the invention. According to yet another embodiment of the invention, in a high power system, contactor arrangement 36 may be integrated into a re-combiner box that receives the output of multiple combiner boxes, with the output of the re-combiner box being provided to DC bus 32 and PV inverter 18.

By selectively connecting the PV array groups 12 to the PV inverter 18 in a specified series arrangement or a parallel arrangement, the amount/level of voltage provided from the PV array groups 12 to the DC link 32 of PV inverter 18 can be controlled. For example, with respect to the first and second PV arrays 14, 16 in FIG. 1, connecting the PV arrays 12 to the PV inverter 18 in the series arrangement serves to "double" the level of the voltage on the DC link 32 and received by the PV inverter 18 as compared to the level of DC voltage received by the PV inverter 18 when the first and second PV array groups 14, 16 are connected in the parallel arrangement. As used herein, the term "double" is meant to encompass an actual doubling of the DC link voltage and also an approximate doubling of the DC link voltage provided by the series arrangement as compared to the DC link voltage achieved in the parallel arrangement, since it is recognized that the voltage output of the first PV array 14 and the second PV array 16 may not be identical and that the arrangement thereof in a series arrangement may thus not be exactly double that of the parallel arrangement.

Such a controlling of the working voltage of the PV inverter 18 is especially beneficial for operation of a PV power system 10, as it is recognized that the DC power and voltage generated by PV arrays 12 is dependent on the amount of solar irradiation received by the PV arrays and is thus highly variable. Accordingly, the selective connecting of the PV arrays 12 to the PV inverter 18 in a specified series arrangement or parallel arrangement that is provided by contactor arrangement 36 in combiner box 34 allows for controlling of the working voltage at which the PV inverter 18 operates. The variation of the DC voltage received by the PV inverter 18 from the PV arrays 12 can thus be minimized and the PV inverter 18 can be operated at an optimal working voltage within a DC voltage operating window, such that the PV inverter 18 operates at a higher or peak efficiency. In selectively connecting the PV arrays 12 to the PV inverter 18 in a specified series arrangement or parallel arrangement via contactor arrangement 36, it is recognized that the range of DC voltages for maximum power point (MPP) voltage of the PV array is predefined and that the control and management of the contactor arrangement 36 is based on observed voltages and powers for a given PV array size.

To control actuation/switching of contactor arrangement 36, and the corresponding amount/level of voltage provided from the PV arrays 12 to the PV inverter 18, a series/parallel controller 38 is provided in PV system 10 that is operationally coupled to the contactor arrangement 36. According to an exemplary embodiment of the invention, series/parallel controller 38 is in the form of a separate dedicated controller for contactor arrangement 36. It is recognized, however, that series/parallel controller 38 could be integrated into inverter controller 28, such that a single controller would control functions of PV inverter 18 along with the controlling of contactor arrangement 36. The series/parallel controller 38 develops and implements a switching strategy to control switching of contactor arrangement 36 such that the PV inverter 18 is operated within a pre-determined voltage operating window, between a minimum voltage value and a maximum voltage value (i.e., upper and lower voltage limits).

According to one embodiment of the invention, the series/parallel controller 38 is configured to measure the DC voltage output from the PV arrays 12 and, as such, the series/parallel controller 38 may include voltage sensors 40 to measure the DC voltage, with the DC voltage being measured on a continuous basis or on a periodic basis at certain pre-determined intervals, such that the contactor arrangement 36 is dynamically controlled during operation of the PV arrays 12 and the PV inverter 18. Alternatively, and according to another embodiment of the invention, the series/parallel controller 38 is configured to measure the DC voltage on the DC link 32. In either embodiment, the series/parallel controller 38 compares the measured DC voltage to one or more pre-determined voltage thresholds. According to embodiments of the invention, the voltage thresholds may be set as the minimum operating voltage of DC link 32 (i.e., minimum safe or rated DC link voltage), as determined by the AC load 20 connected to PV inverter 18 and/or the MPPT algorithm applied by the PV inverter 18, and as a maximum voltage rating of the PV inverter 18 or maximum safe operating voltage of DC link 32. Based on this comparison, the series/parallel controller 38 controls the contactor arrangement 36 to connect PV array groups 12 in one of a specified series arrangement and the parallel arrangement in order to operate the PV inverter 18 in the most efficient manner possible. That is, the series/parallel controller 38 determines if the level of DC voltage to be received by the PV inverter 18 from the PV arrays 12, with the contactor arrangement 36 switched to connect the PV arrays 12 to the PV inverter 18 in a parallel arrangement, meets a minimum PV inverter operation voltage value. If so, the series/parallel controller 38 functions to control the contactor arrangement 36 to connect specified PV arrays 12 in a parallel arrangement. Otherwise, the series/parallel controller 38 functions to control the contactor arrangement 36 to connect a specified number of PV arrays 12 in a series arrangement as is deemed necessary to meet the minimum PV inverter operation voltage value. That is, the series/parallel controller 38 functions to control the contactor arrangement 36 to connect the minimum number of PV arrays 12 in a series arrangement that is needed to provide a level of DC voltage to the DC link 32 that exceeds the minimum PV inverter operation voltage value (i.e., the minimum DC link voltage). In switching/operating of the contactor arrangement 36 to connect PV arrays 12 to the PV inverter 18 in a specified arrangement, it is noted that the PV arrays 12 continue to operate at their maximum power point (MPP) voltage when connected in the specified arrangement, such that the efficiency of the PV inverter 18 is optimized.

According to embodiments of the invention, the switching of contactors in contactor arrangement 36 to connect the PV array groups 12 in one of a specified series arrangement or parallel arrangement can be done online or at zero current. When the altering of the contactor arrangement 36 occurs while PV power system 10 is online, the series/parallel controller 38 commands switching of contactors in contactor arrangement 36 upon the threshold voltage being reached, thereby causing the voltage level on DC link 32 to be altered. In altering the voltage level on DC link 32, the DC link capacitors 42 prevent a step change in the DC link voltage and allow the PV inverter control to react to the change in DC link voltage without affecting the operation thereof. In addition to functioning to alter the contactor arrangement 36, the series/parallel controller 38 also communicates this switching of contactors in the contactor arrangement 36 to the MPPT algorithm 30. Based on this communication, the MPPT algorithm 30 corrects the $V_{DC}$ reference as per the new voltage levels on DC link 32 caused by the new contactor arrangement, so as to help correct the voltage regulation of DC link voltage close to the MPPT point on PV inverter start-up.

Figure 4:
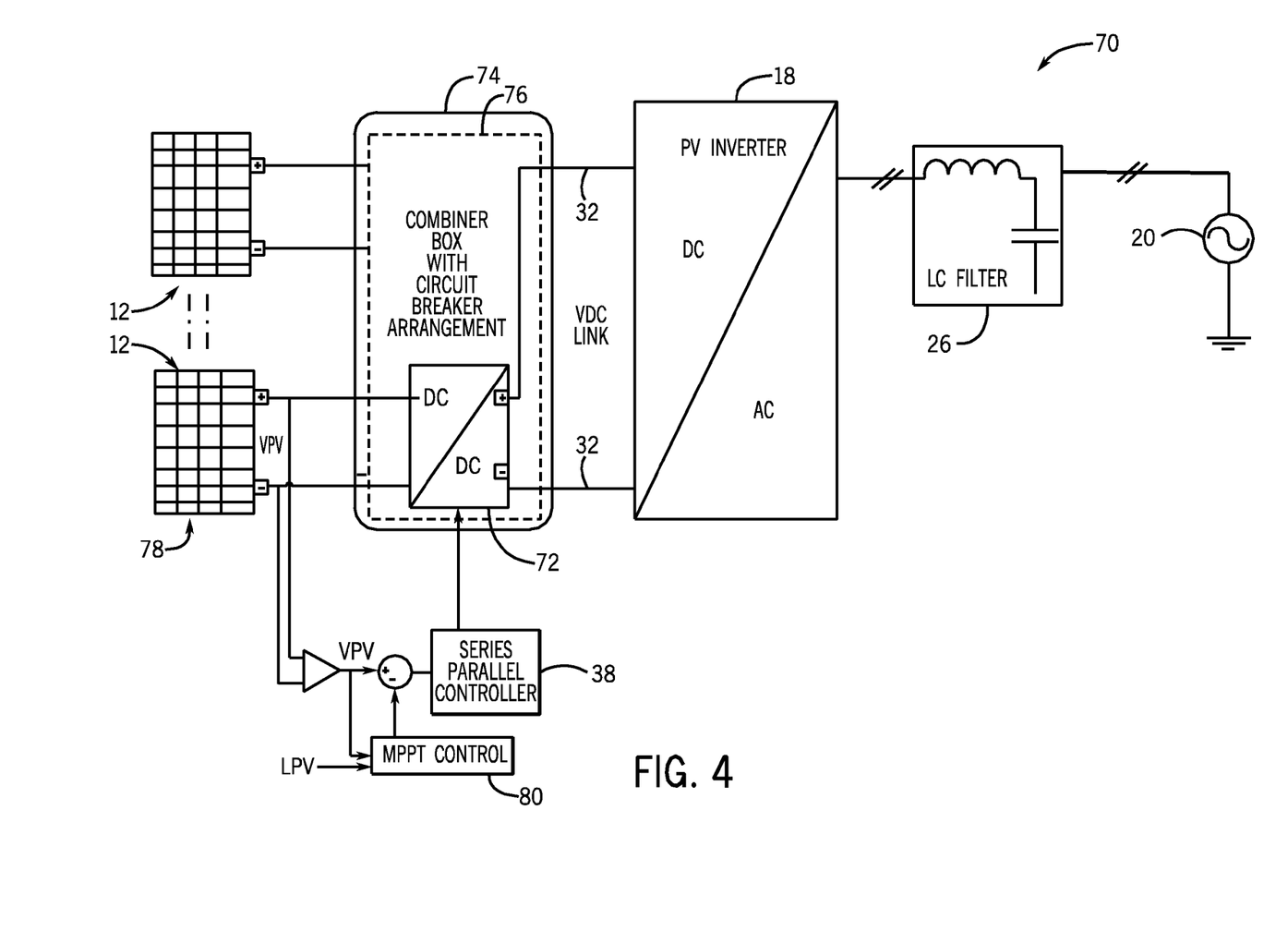
FIG. 4 is a block schematic diagram of a PV power system incorporating a selectively modifiable contactor arrangement and partial rating DC-DC converter according to an embodiment of the present invention.

Referring now to FIG. 4, a PV power system 70 is shown according to another embodiment of the invention. The PV power system 70 is similar to the PV power system 10 of FIG. 1, except that a partial rating DC-DC converter 72 is provided in the PV power system 70. According to an exemplary embodiment, DC-DC converter 72 is incorporated into a combiner box 74 in conjunction with a contactor arrangement 76; however, it is recognized that the DC-DC converter 72 could also be placed outside the combiner box 74 as well, according to another embodiment of the invention. The DC-DC converter 72 is connected to one or more of PV arrays 12 in PV power system 10, such as the PV array 78 shown in FIG. 4. According to embodiments of the invention, and depending on the architecture of contactor arrangement 76, the DC-DC converter 72 can be in the form of a boost converter that functions to boost the voltage of a PV array to the higher voltage of the DC link 32 or can be in the form of a buck converter that functions to step-down the voltage of a PV array. It is recognized, however, that the DC-DC converter 72 could also have a different topology other than a traditional boost or buck converter topology, with the DC-DC converter 72 having any topology that provides for the stepping-up or stepping-down of voltage.

In altering the contactor arrangement 36 at zero current, a start-up circuit 44 is employed in PV power system 10 to pull down the PV open circuit voltage below the maximum safe operating voltage of the PV inverter 18, according to an embodiment of the invention. If the DC link voltage at PV open circuit is determined to be greater than a safe operating voltage present on PV inverter 18 upon switching to the new contactor arrangement, the start-up circuit 44 loads the PV arrays 12 to bring down the DC link voltage. The series/parallel controller 38 then sends an inverter start command to PV inverter 18 so as to initiate normal operation thereof. The MPPT control algorithm 30 will generate the PV voltage reference to draw maximum power from the PV power system 10. According embodiments of the invention, the startup circuit 44 may be a contactor based circuit that provides a fixed load to PV array 12 or may be a DC-DC converter based circuit where the load on the PV array 12 could be controlled depending on the voltage requirements.

Figure 2:
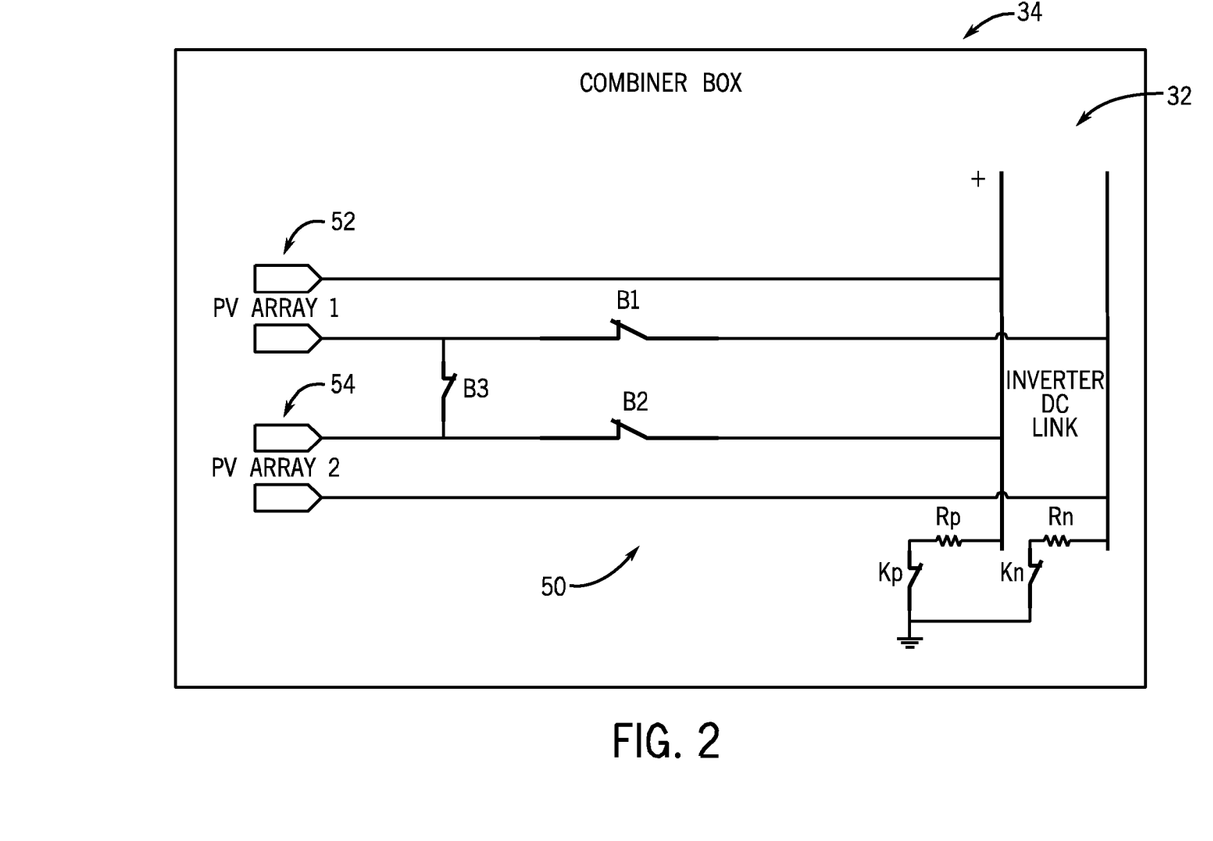
FIG. 2 is a block schematic diagram of a selectively modifiable contactor arrangement included in the PV power system of FIG. 1 according to an embodiment of the present invention.
Figure 3:
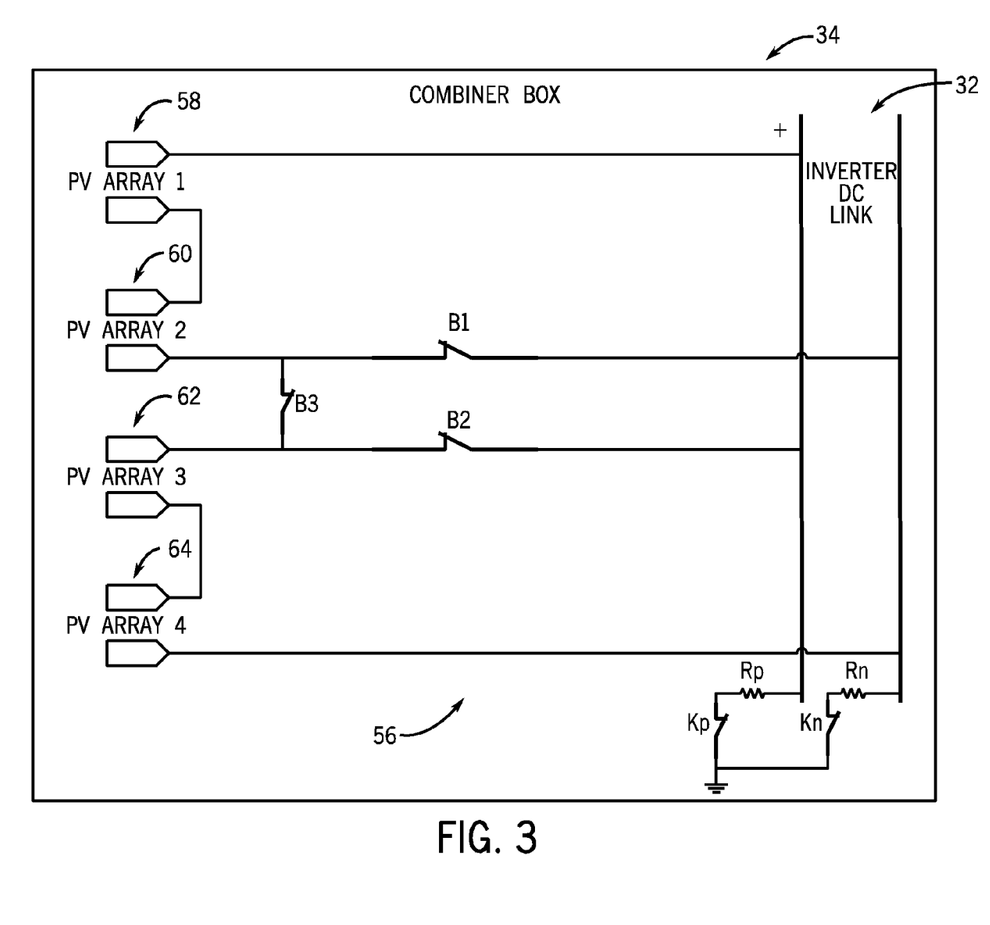
FIG. 3 is a block schematic diagram of a selectively modifiable contactor arrangement included in the PV power system of FIG. 1 according to another embodiment of the present invention.

Referring now to FIGS. 2 and 3, exemplary contactor arrangements that can be implemented in combiner box 34 are shown according to embodiments of the invention. It is recognized that the exact construction of contactor arrangement will vary and is dependent on the voltage requirements of the PV power system 10 and the number of PV arrays utilized in PV power system 10. Referring first to FIG. 2, an architecture of a contactor arrangement 50 is provided for selectively switching two PV arrays 52, 54 into series and parallel arrangements. The contactor arrangement 50 could be implemented in combiner box 34 for a PV system connected to a 208 VAC grid, in which the minimum PV inverter DC link voltage required is 320 V. The contactor arrangement 50 includes three contactors B1, B2, B3 therein that are selectively altered to an On or Off state, such as by way of series/parallel controller 38 in FIG. 1, for example.

The state of contactors B1, B2, B3 is selectively altered to control the voltage provided to DC link 32 from first and second PV arrays 52, 54. When contactors B1, B2 are operating in the On state and contactor B3 is in the Off state, first and second PV arrays 52, 54 are arranged in a parallel arrangement. Conversely, when contactors B1, B2 are operating in the Off state and contactor B3 is in the On state, first and second PV arrays 52, 54 are arranged in a series arrangement, such that a PV array arrangement with two series stages is provided. In operation, the state of contactors B1, B2, B3 is controlled (by series/parallel controller 38) in order to keep the voltage provided to the DC link 32 (of PV inverter 18, FIG. 1) above the minimum required inverter DC link voltage of 320 V. This arrangement widens the operating voltage range from 160V-500V instead of 320V-500V. Thus, the arrangement of contactors B1, B2, B3 in contactor arrangement 50 at various PV array voltages for maintaining the DC link voltage above 320 V is summarized in Table 1 as follows:

TABLE 1

| PV Array Voltage ($V_{PV}$) | Number of Series Stages | DC Link Voltage ($V_{DC}$) | ON Contactor |
| --- | --- | --- | --- |
| 200 | 2 | 400 | B3 |
| 250 | 2 | 500 | B3 |
| 300 | 2 | 600 | B3 |
| 320 | 2 | 640 | B3 |
| 375 | 1 | 375 | B1, B2 |
| 400 | 1 | 400 | B1, B2 |
| 450 | 1 | 450 | B1, B2 |
| 500 | 1 | 500 | B1, B2 |

In operation of the PV inverter 18 (FIG. 1), it is recognized the positive and negative DC buses of DC link 32 should not go outside the range of +/−600 V DC with respect to ground, such as might occur as indicated in Table 1 when the PV array voltage is 320 V and the PV arrays 52, 54 are connected in series to generate a DC link voltage of 640. In such a scenario, secondary contactors Kp, Kn, and resistors Rp, Rn included in contactor arrangement 50 are implemented to momentarily load the PV arrays 52, 54 during transition to maintain the voltage within the required voltage range. The contactors Kp, Kn, and resistors Rp, Rn also help to reduce the DC link voltage of the PV inverter during inverter start-up, with the PV inverter 18 also functioning to vary the DC link voltage to match the PV array voltage at start-up.

Referring now to FIG. 3, an architecture of a contactor arrangement 56 is provided for selectively switching four PV arrays 58, 60, 62, 64 into series and parallel arrangements. The contactor arrangement 56 could be implemented in combiner box 34 for a PV power system connected to a 480 V three phase grid, in which the minimum inverter DC link voltage required is 750 V. The contactor arrangement 56 includes three contactors B1, B2, B3 therein that are selectively altered to an On or Off state, such as by way of series/parallel controller 38 in FIG. 1, for example.

In the architecture of contactor arrangement 56 of FIG. 3, the first and second PV arrays 58, 60 are always connected in series and the third and fourth PV arrays 62, 64 are always connected in series. The state of contactors B1, B2, B3 is thus controlled to selectively provide a PV array arrangement with two series stages or four series stages. When contactors B1, B2 are operating in the On state and contactor B3 is in the Off state, the series of the first and second PV arrays 58, 60 is arranged in parallel with the series of the third and fourth PV arrays 62, 64, such that a two series stage for the PV arrays is provided. When contactors B1, B2 are operating in the Off state and contactor B3 is in the On state, the series of the first and second PV arrays 58, 60 is arranged in series with the series of the third and fourth PV arrays 62, 64, such that a four series stage for the PV arrays is provided. In operation, the state of contactors B1, B2, B3 is controlled in order to keep the voltage provided to the DC link 32 of PV inverter 18 (FIG. 1) above the minimum required inverter DC link voltage of 750 V, while desirably staying below a safe DC voltage. Thus, the arrangement of contactors B1, B2, B3 in contactor arrangement 56 at various PV array voltages for maintaining the DC link voltage above 750 V is summarized in Table 2 as follows:

TABLE 2

| PV Array Voltage ($V_{PV}$) | Number of Series Stages | DC Link Voltage ($V_{DC}$) | ON Contactor |
|---|---|---|---|
| 200 | 4 | 800 | B3 |
| 250 | 4 | 1000 | B3 |
| 300 | 4 | 1200 | B3 |
| 350 | 4 | 1400 | B3 |
| 375 | 2 | 750 | B1, B2 |
| 400 | 2 | 800 | B1, B2 |
| 450 | 2 | 900 | B1, B2 |
| 500 | 2 | 1000 | B1, B2 |

As shown in FIG. 3, contactors Kp, Kn, and resistors Rp, Rn are included in contactor arrangement 56 and are implemented to momentarily load the PV arrays 58, 60, 62, 64 during transition to maintain the voltage within the required voltage range. The contactors Kp, Kn, and resistors Rp, Rn also help to reduce the DC link voltage of the PV inverter during inverter start-up.

Referring now to FIG. 4, a PV power system 70 is shown according to another embodiment of the invention. The PV power system 70 is similar to the PV power system 10 of FIG. 2, except that a partial rating DC-DC converter 72 is provided in the PV power system 70. According to an exemplary embodiment, DC-DC converter 72 is incorporated into a combiner box 74 in conjunction with a contactor arrangement 76; however, it is recognized that the DC-DC converter 72 could also be placed outside the combiner box 74 as well, according to another embodiment of the invention. The DC-DC converter 72 is connected to one or more of PV arrays 12 in PV power system 10, such as the PV array 78 shown in FIG. 4. According to embodiments of the invention, and depending on the architecture of contactor arrangement 76, the DC-DC converter 72 can be in the form of a boost converter that functions to boost the voltage of a PV array to the higher voltage of the DC link 32 or can be in the form of a buck converter that functions to step-down the voltage of a PV array. It is recognized, however, that the DC-DC converter 72 could also have a different topology other than a traditional boost or buck converter topology, with the DC-DC converter 72 having any topology that provides for the stepping-up or stepping-down of voltage.

Beneficially, the inclusion of DC-DC converter 72 in combiner box 74 in conjunction with contactor arrangement 76 provides for greater flexibility in the PV power system 70. For example, the inclusion of DC-DC converter 72 in combiner box 74 in conjunction with contactor arrangement 76 enables having any number of PV arrays 12 in series, and hence enables controlling of the DC link voltage more precisely and without having unnecessarily high voltage on the DC link 32. When functioning as a boost converter, the partial rating DC-DC converter 72 provides for the delivering of power from those PV arrays 12 not included/used in the series or parallel arrangement of PV arrays achieved via contactors in contactor arrangement 76, and boosts the voltage of such a PV array to the DC link voltage. As another example of the flexibility provided by DC-DC converter 72, the converter can function as a buck converter to address the unequal power outputs of PV arrays 12 in PV power system 10, such as may be caused by irradiance variation, shadowing, temperature, etc., that would cause power to vary unequally between PV arrays.

According to an exemplary embodiment of the invention, DC-DC converter 72 is controlled to perform the MPPT for the PV arrays 12 connected at the input of the DC-DC converter 72. That is, the DC-DC converter 72 does a localized MPPT for the PV array(s) 12 connected thereto (e.g., PV array 78), such that a better yield can be achieved as compared to the global MPPT performed by PV inverter 18. This localized MPPT performed by the DC-DC converter 72, indicated at 80, helps to offset any loss of yield that is experienced due to losses associated with the DC-DC converter 72.

Figure 5:
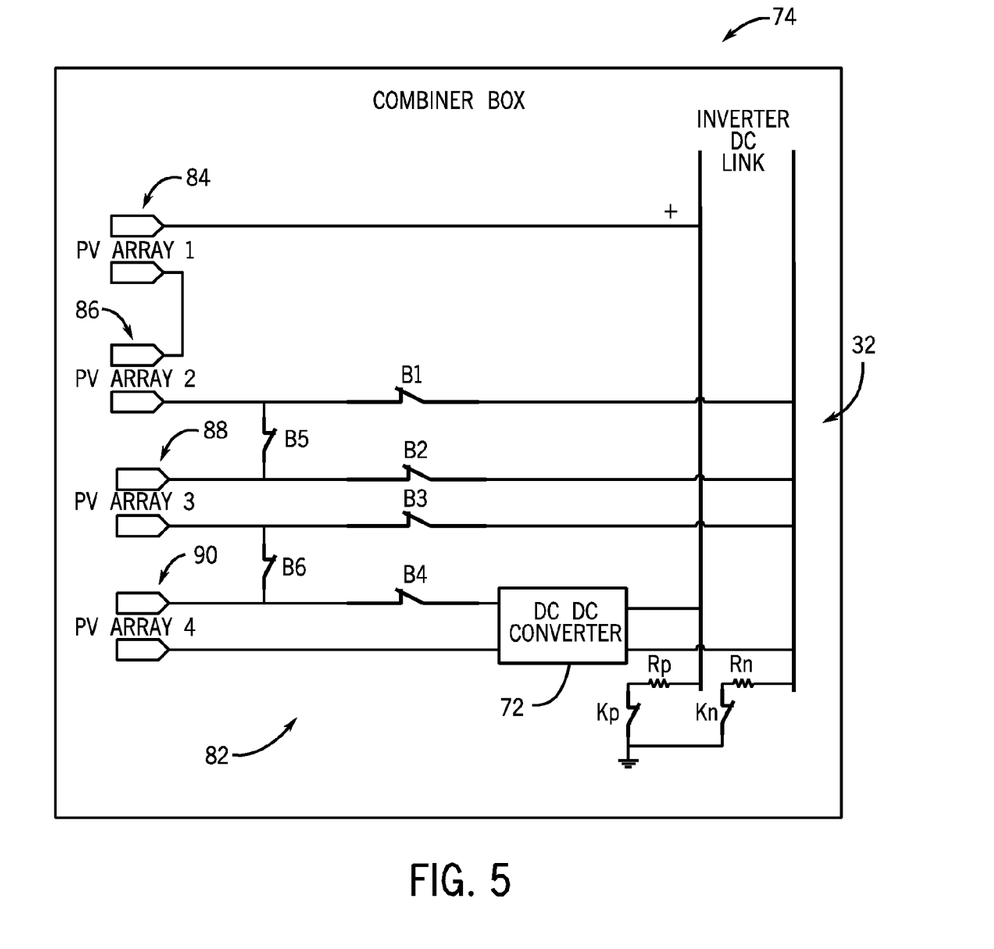
FIG. 5 is a block schematic diagram of a selectively modifiable contactor arrangement and partial rating DC-DC boost converter included in the PV power system of FIG. 4 according to an embodiment of the present invention.
Figure 6:
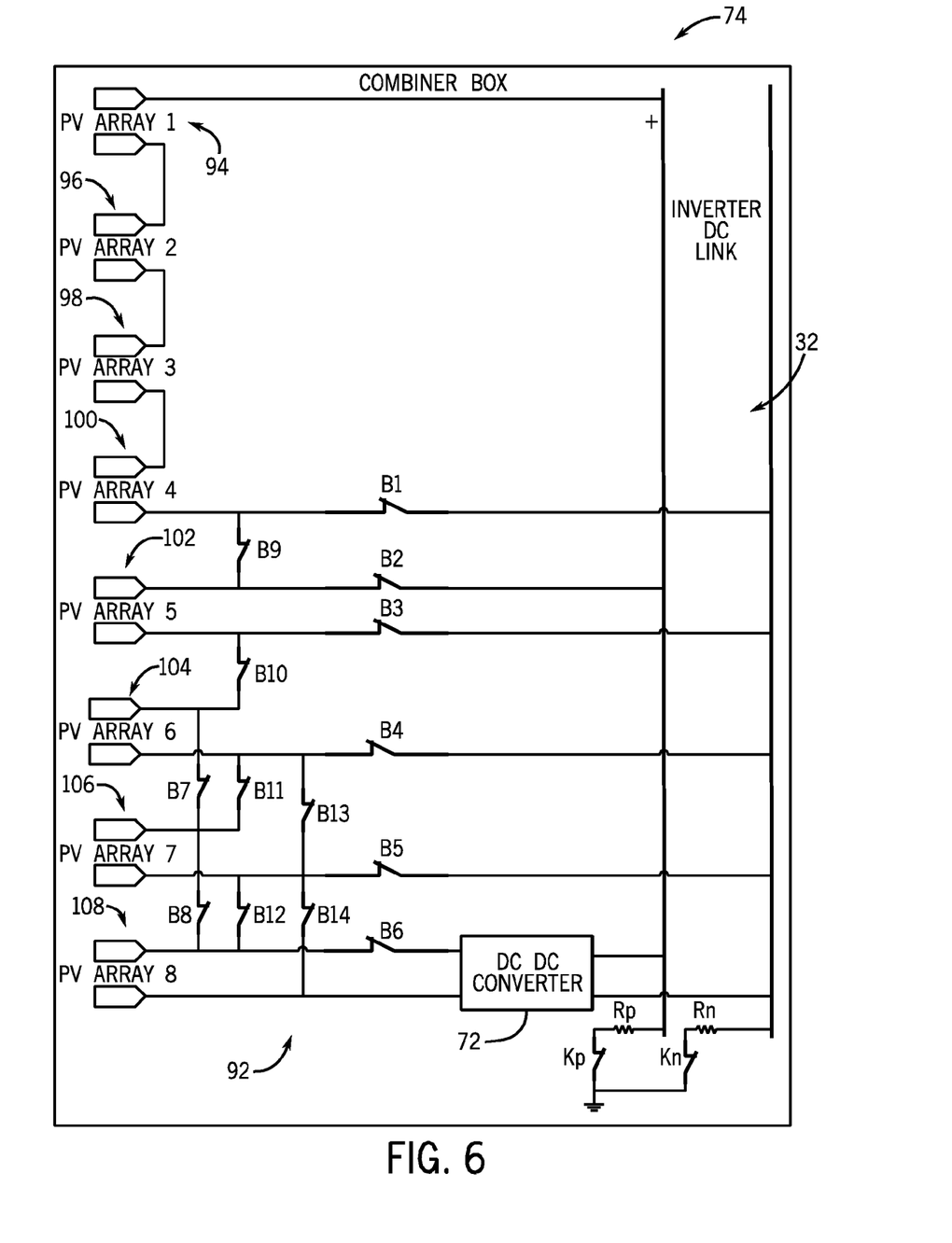
FIG. 6 is a block schematic diagram of a selectively modifiable contactor arrangement and partial rating DC-DC boost converter included in the PV power system of FIG. 4 according to another embodiment of the present invention.

Referring now to FIGS. 5 and 6, exemplary contactor arrangements are shown, according to embodiments of the invention, that can be implemented in combiner box 74, with a partial rating DC-DC boost converter 72 (or another DC-DC converter with a topology that provides for the stepping-up of voltage, such as an isolated DC-DC converter, basic boost, etc.) being incorporated into combiner box 74 along with the contactor arrangement. It is recognized that the exact construction of contactor arrangement and positioning of boost converter 72 will vary and is dependent on the voltage requirements of the PV power system 10 and the number of PV arrays 12 utilized in the PV power system. Referring first to FIG. 5, an architecture of a contactor arrangement 82 and incorporated boost converter 72 is provided for selectively switching four PV arrays 84, 86, 88, 90 into series and parallel arrangements. The contactor arrangement 82 could be implemented in combiner box 74 for a PV power system connected to a 480 V three phase grid, in which the minimum inverter DC link voltage required is 750 V. The contactor arrangement 82 includes six contactors B1, B2, B3, B4, B5, B6 therein that are selectively altered to an On or Off state, such as by way of series/parallel controller 38 in FIG. 4, for example. A partial rating DC-DC boost converter 72 is provided on the fourth PV array 90, as shown in FIG. 5, to boost the voltage of that PV array to the higher voltage of the DC link 32.

The state of contactors B1, B2, B3, B4, B5, B6 is selectively altered to control the voltage provided to DC link 32 from the four PV arrays 84, 86, 88, 90. In the architecture of contactor arrangement 82 of FIG. 5, the first and second PV arrays 84, 86 are always connected in series, with the state of contactors B1, B2, B3, B4, B5, B6 being controlled to selectively connect the third and/or fourth PV arrays 88, 90 in series or parallel to the first and second PV arrays 84, 86, so as to provide a PV array arrangement with two series stages, three series stages, or four series stages. Additionally, contactor B6 is controlled to selectively connect the fourth PV array 90 to boost converter 72, such that the boost converter 72 can be bypassed or operating to condition/boost the power received from the fourth PV array 90.

When contactors B5, B6 are operating in the On state and contactors B1, B2, B3, B4 are in the Off state, the series of the first and second PV arrays 84, 86 is arranged in series with both the third and fourth PV arrays 88, 90, such that a four series stage for the PV arrays is provided and such that boost converter 72 is bypassed. When contactors B1, B2, B6 are operating in the On state and contactors B3, B4, B5 are in the Off state, the third and fourth PV arrays 88, 90 are connected in series, with the series of the third and fourth PV arrays 88, 90 being connected in parallel with the series of the first and second PV arrays 84, 86, such that a two series stage for the PV arrays is provided and such that boost converter 72 is bypassed. When contactors B3, B4, B5 are operating in the On state and contactors B1, B2, B6 are in the Off state, the series of the first and second PV arrays 84, 86 is arranged in series with the third PV array 88, such that a three series stage for the PV arrays is provided. Additionally, when contactors B3, B4, B5 are operating in the On state and contactors B1, B2, B6 are in the Off state, the fourth PV array 90 is left out of the series arrangement of the first, second, and third PV arrays 84, 86, 88, with the fourth PV array 90 being connected to boost converter 72 such that the boost converter 72 is operational. The boost converter 72 boosts the voltage received from the fourth PV array 90 to a level of the voltage on DC link 32.

Thus, the arrangement of contactors B1, B2, B3, B4, B5, B6 in contactor arrangement 82, and the status of boost converter 72, at various PV array voltages for maintaining the DC link voltage above 750 V is summarized in Table 3 as follows:

TABLE 3

| PV Array Voltage ($V_{PV}$) | Number of Series Stages | ON Contactors | DC Link Voltage ($V_{DC}$) | Boost Converter Status |
|---|---|---|---|---|
| 220 | 4 | B5, B6 | 880 | Bypassed |
| 260 | 3 | B3, B4, B5 | 780 | Operating |
| 300 | 3 | B3, B4, B5 | 900 | Operating |
| 350 | 3 | B3, B4, B5 | 1050 | Operating |
| 416 | 2 | B1, B2, B6 | 832 | Bypassed |
| 480 | 2 | B1, B2, B6 | 960 | Bypassed |

For the architecture of contactor arrangement 82 and incorporated partial rating DC-DC boost converter 72 shown in FIG. 5, the power rating of the boost converter 72 is 25% of the total power. The arrangement of contactors B1, B2, B3, B4, B5, B6 and boost converter 72 allows for putting three PV arrays in series, with the boost converter 72 then boosting the voltage of the fourth PV array to the DC link voltage. By way of the boost converter 72 implementing a localized MPPT for the fourth PV array 90, a better overall system efficiency can be achieved as compared to a PV power system that utilizes a conventional two stage PV inverter that includes a DC-DC stage. That is, as compared to a conventional two stage PV inverter that includes a DC-DC stage that provides an overall system efficiency of 98.5%, the contactor arrangement 82 and boost converter 72 shown in FIG. 5 provide an overall system efficiency of 99.62% when the state of the contactors is set to put three PV arrays in series and when the partial rating DC-DC boost converter 72 is used to boost one PV array (i.e., fourth PV array 90). When two or four PV arrays are in series, the efficiency is 100%.

Referring now to FIG. 6, an architecture of a contactor arrangement 92 and incorporated boost converter 72 is shown according to another embodiment of the invention. The contactor arrangement 92 and incorporated boost converter 72 are provided for selectively switching eight PV arrays 94-108 into series and parallel arrangements. The contactor arrangement 92 could be implemented in combiner box 74 for a PV power system connected to a 480 V three phase grid, in which the minimum inverter DC link voltage required is 750 V. In the embodiment of FIG. 6, the eight PV arrays 94-108 are lower voltage arrays that give better control range of the DC link voltage, as compared to the four "higher" voltage PV arrays of FIG. 5 that also provided power for a 480 V three phase grid in which a 750 V minimum inverter DC link voltage was required. For example, the PV arrays 94-108 could be configured as 300 V PV arrays (e.g., a standard 600 V PV array with a midpoint disconnected), with the 300 V PV arrays being utilized to achieve a more precisely controlled DC link voltage.

As shown in FIG. 6, the contactor arrangement 92 includes fourteen contactors B1-B14 therein that are selectively altered to an On or Off state, such as by way of series/parallel controller 38 in FIG. 4, for example. A partial rating DC-DC boost converter 72 is provided on the eighth PV array 108 to boost the voltage of that PV array to the higher voltage of the DC link 32. The states of contactors B1-B14 are selectively altered to control the voltage provided to DC link 32 from the eight PV arrays 94-108. In the architecture of contactor arrangement 92 of FIG. 6, the first, second, third and fourth PV arrays 94, 96, 98, 100 are always connected in series, with the state of contactors B1-B14 being controlled to selectively connect the fifth, sixth, seventh, and/or eighth PV arrays 102, 104. 106, 108 in series or parallel, so as to provide a PV array arrangement with four series stages, five series stages, six series stages, or seven series stages. Additionally, the contactor arrangement 92 is controlled to selectively connect some combination of the fifth, sixth, seventh, and eighth PV arrays 102, 104. 106, 108 to boost converter 72, such that the boost converter 72 can be operating to boost the power received therefrom.

When contactors B9, B10, B11, B5, B6 are operating in the On state and the remaining contactors are in the Off state, the series of the first through fourth PV arrays 94, 96, 98, 100 is arranged in series with the fifth, sixth, and seventh PV arrays 102, 104. 106, such that a seven series stage for the PV arrays is provided and such that the eighth PV array 108 is left out of the series/parallel arrangement and is connected to boost converter 72 such that the boost converter 72 is operational. When contactors B9, B10, B4, B8, B14, B6 are operating in the On state and the remaining contactors are in the Off state, the series of the first through fourth PV arrays 94, 96, 98, 100 is arranged in series with the fifth and sixth PV arrays 102, 104, such that a six series stage for the PV arrays is provided. Additionally, when contactors B9, B10, B4, B8, B14, B6 are operating in the On state, the seventh and eighth PV arrays 106, 108 are connected in parallel and the voltage therefrom is passed to boost converter 72, with the boost converter 72 operating to boost the voltage therefrom to the voltage level of the DC link 32. When contactors B9, B3, B7, B8, B6, B13, B14 are operating in the On state and the remaining contactors are in the Off state, the series of the first through fourth PV arrays 94, 96, 98, 100 is arranged in series with the fifth PV array 102, such that a five series stage for the PV arrays is provided. Additionally, when contactors B9, B3, B7, B8, B6, B13, B14 are operating in the On state, the sixth, seventh, and eighth PV arrays 104, 106, 108 are connected in parallel and the voltage therefrom is passed to boost converter 72, with the boost converter 72 operating to boost the voltage therefrom to the voltage level of the DC link 32. When contactors B1, B2, B10, B11, B12 are operating in the On state and the remaining contactors are in the Off state, the fifth through eighth PV arrays 102, 104, 106, 108 are connected in series, with the series of the fifth through eighth PV arrays being connected in parallel with the series of the first through fourth PV arrays 94, 96, 98, 100, such that a four series stage for the PV arrays is provided and such that boost converter 72 is bypassed.

Thus, the arrangement of contactors in contactor arrangement 92, and the status of boost converter 72, at various PV array voltages for maintaining the DC link voltage above 750 V is summarized in Table 4 as follows:

TABLE 4

| PV Array Voltage ($V_{PV}$) | Number of Series Stages | ON Contactors | DC Link Voltage ($V_{DC}$) | Boost Converter Status |
|---|---|---|---|---|
| 110 | 7 | B9, B10, B11, B5, B6 | 770 | Operating |
| 130 | 6 | B9, B10, B4, B8, B14, B6 | 780 | Operating |
| 150 | 5 | B9, B3, B7, B8, B6, B13, B14 | 750 | Operating |
| 175 | 5 | B9, B3, B7, B8, B6, B13, B14 | 875 | Operating |
| 208 | 4 | B1, B2, B10, B11, B12 | 832 | Bypassed |
| 240 | 4 | B1, B2, B10, B11, B12 | 960 | Bypassed |

For the architecture of contactor arrangement 92 and incorporated partial rating DC-DC boost converter 72 shown in FIG. 6, the power rating of the boost converter 72 is 37.5% of the total power. By way of the boost converter 72 implementing a localized MPPT for the one or more PV arrays connected thereto, a better overall system efficiency can be achieved as compared to a PV power system that utilizes a conventional two stage PV inverter that includes a DC-DC stage. That is, as compared to a conventional two stage PV inverter that includes a DC-DC stage that provides an overall system efficiency of 98.5%, the contactor arrangement 92 and boost converter 72 shown in FIG. 6 provide an overall system efficiency of 99.44% for five PV arrays in series, 99.62% for six PV arrays in series, and 99.81% for seven PV arrays in series. When four PV arrays are in series, the efficiency is 100%.

Figure 7:
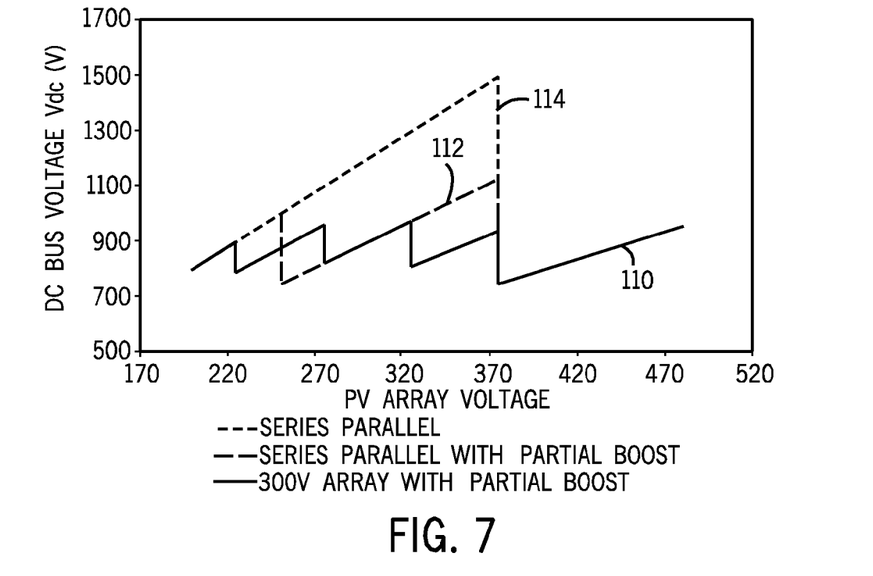
FIG. 7 is a graph illustrating the voltage distribution for the contactor arrangements, with and without a DC-DC converter, shown in FIGS. 3, 5, and 6.

Referring now to FIG. 7, a graph is provided that illustrates the voltage distribution for the contactor arrangements shown in FIGS. 3, 5, and 6. As shown by the voltage values 110, 112 114 therein, the inclusion of partial rating DC-DC boost converter 72 in the contactor arrangements 82, 92, illustrated in FIGS. 5 and 6 enables controlling of the DC link voltage more precisely (see voltages 110, 112) and without having unnecessarily high voltage on the DC link 32, as compared to the contactor arrangement 56, illustrated in FIG. 3 that does not include partial rating DC-DC boost converter 72 (see voltage 114).

Figure 8:
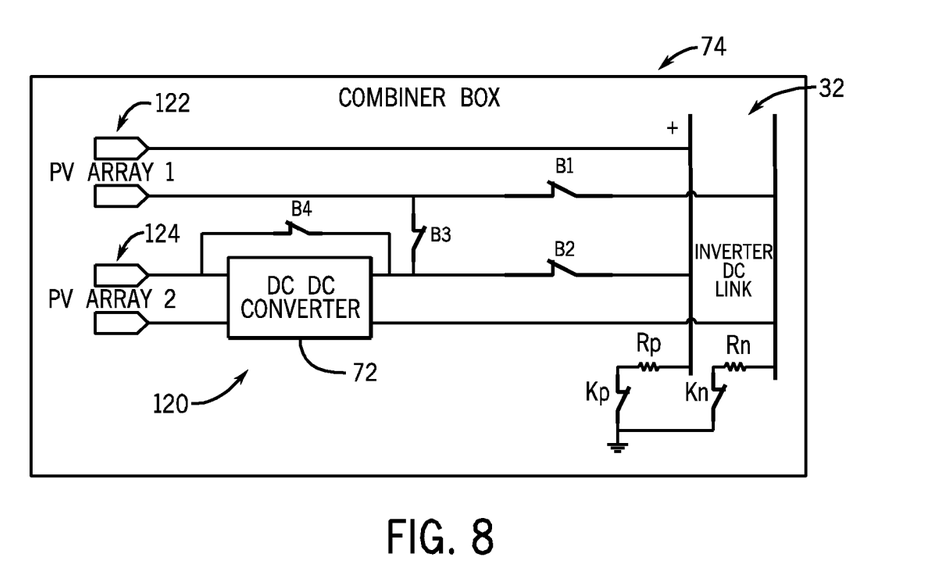
FIG. 8 is a block schematic diagram of a selectively modifiable contactor arrangement and partial rating DC-DC buck converter included in the PV power system of FIG. 4 according to another embodiment of the present invention.

Referring now to FIG. 8, an exemplary contactor arrangement 120 is shown according to an embodiment of the invention that can be implemented in combiner box 74, with a partial rating DC-DC buck converter 72 (or another DC-DC converter with a topology that provides for the stepping-down of voltage) being incorporated into combiner box 74 along with the contactor arrangement. This architecture can be identified generally as a "double array with buck converter system." The architecture is provided for selectively switching first and second PV arrays 122, 124 into series and parallel arrangements. The contactor arrangement 120 includes four contactors B1, B2, B3, B4, therein that are selectively altered to an On or Off state, such as by way of series/parallel controller 38 in FIG. 4, with buck converter 72 being provided on the second PV array 124.

The state of contactors B1, B2, B3, B4, is selectively altered to control the voltage provided to DC link 32 from the two PV arrays 122, 124. In operation of contactor arrangement 82 of FIG. 8, when the PV array voltage is determined to be greater than the minimum DC link voltage required for operation of PV inverter 18 (FIG. 4), contactors B1, B2, B4, are operated in the On state and contactor B3 is operated in the Off state, such that the first and second PV arrays 122, 124 are connected in parallel. When the PV array voltage is determined to be less than the minimum DC link voltage required for operation of PV inverter 18 (FIG. 4), contactor B3 is operated in the On state and contactors B1, B2, B4, are operated in the Off state, such that the first PV array 122 is connected in series with an output of the buck converter 72, which is connected to second PV array 124 (FIG. 8). As the buck converter 72 is connected in series with first PV array 122, the buck output voltage is decided by the power ratio of the first and second PV arrays 122, 124, identified as $P_2/P_1$. The power ratio is defined as:

$$V_{buck}=(P_2/P_1)*V_1$$

$$V_{dc}=V_{buck}+V_{array1} \quad [\text{Eqn. 1}],$$

where $P_1$ is the power output of first PV array, $P_2$ is the power output of second PV array, $V_1$ is the output voltage of first PV array, $V_{buck}$ is the output voltage of buck converter, and $V_{dc}$ is the DC link voltage.

The control method set forth in connection to FIG. 4, with respect to the localized MPPT tracking, is applicable to the double array with buck converter system shown in FIG. 8. The buck converter 72 performs the MPPT of the second PV array 124, while the MPPT for the first PV array 122 is performed by the central PV inverter 18 (FIG. 4) by controlling the DC link voltage according to $V_{array1}=V_{dc}-V_{buck}$. This control method provides an additional MPPT channel when the buck converter 72 is operating. As the $P_2/P_1$ ratios are significant, it helps in increasing the output yield of the PV power system 10.

Figure 9:
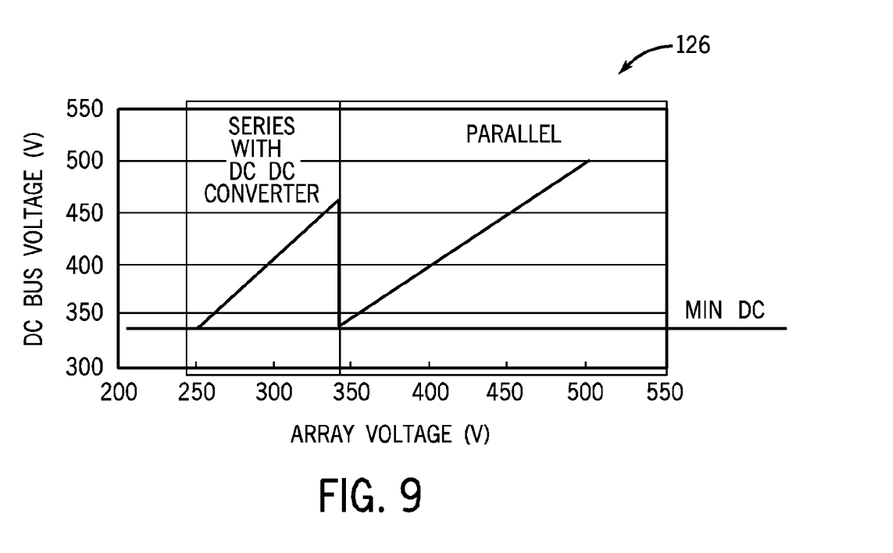
FIG. 9 is a graph illustrating PV array voltages and DC link voltages for a PV power system connected to a single phase 240 VAC system.

Referring now to FIG. 9, a graph 126 is provided that illustrates the PV array voltage and DC bus voltage for a PV power system connected to a single phase 240 VAC system, where the contactor arrangement 120 of FIG. 8 with buck converter management is implemented. The power ratio $P_2/P_1$ for this curve is 0.36. The minimum DC link voltage for a 240 Vac output is 340V, and thus for a PV array voltage less than 340V, the buck converter is active.

Figure 10:
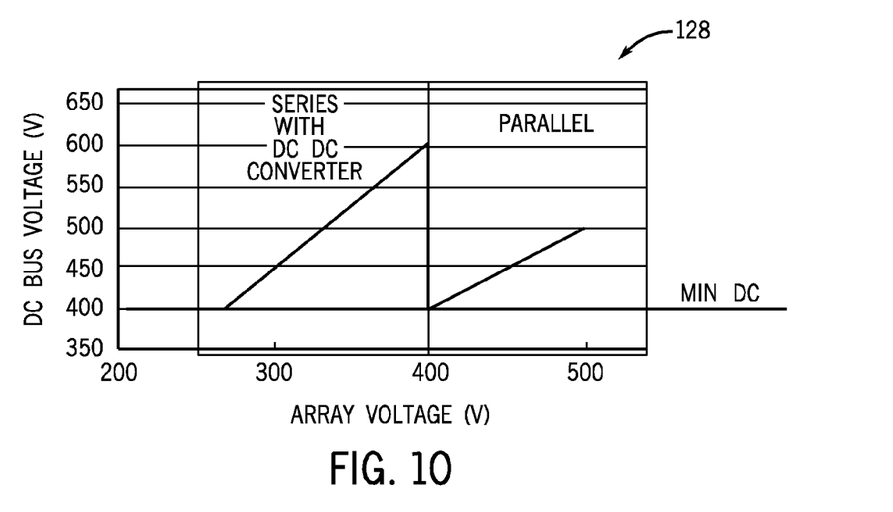
FIG. 10 is a graph illustrating PV array voltages and DC link voltages for a PV power system connected to a single phase 277 VAC system.

Another graph 128 is provided in FIG. 10 that illustrates the PV array voltage and DC bus voltage for a PV power system connected to a single phase 277 VAC system, where the contactor arrangement of FIG. 8 with buck converter management is implemented. The power ratio $P_2/P_1$ for this curve is 0.5. The minimum DC link voltage for a 277 Vac output is 400V, and thus for a PV array voltage less than 400V, the buck converter is active.

Referring back now to FIG. 8, the buck converter 72 included in contactor arrangement 120 has a partial power rating, as it is delivering power only from second PV array 124. This helps improve the efficiency of the DC-DC conversion stage. Regarding the efficiency of the buck converter 72, the CEC efficiency can be considered at 250V, 350V and 480V, for example. In doing so, it is recognized that the buck converter 72 is not active for all PV voltages. For example, in a 240V system, buck converter 72 is bypassed at PV voltages of 350V and 480V, giving 100% DC stage efficiency.

The buck converter power rating and the DC stage efficiency for 208V, 240V and 277V single phase AC systems are shown in Table 5, for a buck converter efficiency considered as 98.5%.

TABLE 5

| VAC | P2/P1 | Buck Converter Rating | DC Stage Efficiency | DC Stage CEC Efficiency |
|---|---|---|---|---|
| 208 | .2 | 16% | 99.75% | 99.92% |
| 208 | .36 | 27% | 99.60% | 99.87% |
| 208 | .5 | 33% | 99.50% | 99.67% |

As discussed above, the buck converter output is dependent on the power ratio of the PV arrays, $P_2/P_1$. Table 6 inserted here below gives the DC link voltage variation with $P_2/P_1$ variation for a 277V single phase AC system, where the minimum DC link voltage required is 400V and the designed $P_2/P_1$ ratio is 0.5. For the higher array voltages, a higher $P_2/P_1$ variation on the lower side is allowed. For example, at a PV array voltage of 310V, variation up to 0.3 is allowed. For a PV array voltage greater than 310V, $P_2/P_1$ ratios lower than 0.3 are possible. The variation of higher side is limited by the NEC requirement to restrict the array voltage below 600V. For lower array voltages, a higher $P_2/P_1$ variation on the upper side is allowed. For example, at a PV array voltage of 375V, variation up to 0.6 is allowed. For a PV array voltage smaller than 375V, $P_2/P_1$ ratios higher than 0.6 are possible.

TABLE 6

| PV Array Voltage ($V_{PV}$) | PV Array Power Ratio (P2/P1) | | | | |
|---|---|---|---|---|---|
| | .3 | .4 | .4 | .6 | .7 |
| 270 | 351 | 378 | 405 | 432 | 459 |
| 300 | 390 | 420 | 450 | 480 | 510 |
| 310 | 403 | 434 | 465 | 496 | 527 |
| 375 | 487.5 | 525 | 562.5 | 600 | 637.5 |
| 400 | 520 | 560 | 600 | 640 | 680 |

Similarly, Table 7 gives the allowed $P_2/P_1$ ratio variation for a 240V single phase AC system.

TABLE 7

| PV Array Voltage ($V_{PV}$) | PV Array Power Ratio (P2/P1) | | | | |
|---|---|---|---|---|---|
| | .3 | .4 | .4 | .6 | .7 |
| 250 | 325 | 350 | 375 | 400 | 425 |
| 275 | 357.5 | 385 | 412.5 | 440 | 467.5 |
| 300 | 390 | 420 | 450 | 480 | 510 |
| 325 | 422.5 | 455 | 487.5 | 520 | 552.5 |
| 340 | 442 | 476 | 510 | 544 | 578 |
| 360 | 468 | 504 | 540 | 576 | 612 |

While examples are set forth above of 208V, 240V and 277V AC systems, it is recognized that the control schemes set forth above for the double array with partial DC-DC buck converter could be applied to various combinations of array voltage ranges and AC grid voltages, including single phase and three phase systems.

According to an exemplary embodiment of the invention, the contactors included in the contactor arrangement of any of FIGS. 2, 3, 5, 6, and 8 are configured as hybrid DC contactors. As described in U.S. patent application Ser. No. 13/440,275 to Eaton Corp., hybrid DC contactors can be beneficially incorporated into PV power systems to provide over-current and short circuit detection and protection at "low" short circuit current magnitudes. The use of hybrid DC contactors in PV power systems also provides for monitoring of both voltage and current for enabling over-current protection, as well as arc fault detection and reverse current detection and fault isolation, including isolation of grounded arrays and floating arrays. The use of hybrid DC contactors in PV power systems also provides fast and consistent openings times (e.g., less than 10 milliseconds) of main contacts.

Beneficially, embodiments of the invention thus provide for the dynamic rearranging of PV arrays to arrange them in one of a series arrangement and a parallel arrangement, so as to provide a controlled DC voltage to a PV inverter. By selectively controlling the state of a plurality of contactors in a contactor arrangement, such as can be housed in a combiner box of the PV power system, the variation in the DC voltage that is received by PV inverter is minimized, thus allowing for elimination of a system level DC-to-DC conversion step, such as by using a DC link capacitor to implement an intermediate energy storage step. Elimination of the DC-to-DC conversion step provides greater efficiencies in the PV power system, with 100% efficiency being achieved when DC-to-DC converters are wholly eliminated from the PV inverter and only the selective arranging of contactors in a series or a parallel arrangement is used to control voltage on the DC link. Greater efficiencies in the PV power system can also still be achieved when incorporating a partial rating DC-DC converter that performs a localized MPPT for one or more PV arrays as compared to a conventional two stage PV inverter that includes a DC-DC stage.

Furthermore, the dynamic rearranging of the PV arrays to arrange them in a specified series or parallel arrangement also effectively increases the DC voltage operating window of the PV system 10. For example, if a DC voltage operating window is commonly 300-600 or 500-1000 VDC, the dynamic rearranging of the PV array groups 14, 16 in series/parallel arrangements, as provided by embodiments of the invention, effectively increases the DC voltage operating window to 150-600 or 250-1000 VDC, respectively, because of the voltage "doubling" provided by the series connection of the PV array groups. Beneficially, the PV inverter can thus harvest more power at high temperatures (when the voltage is low) or low irradiance (when the voltage is low), with the PV inverter thus turning off or being inoperable less frequently.

A technical contribution for the disclosed method and apparatus is that it provides for a controller implemented method for selectively connecting PV arrays in a PV power system in series and parallel arrangements, so as to eliminate the need for a DC-DC conversion in a PV inverter and improve efficiency in the PV power system Therefore, according to one embodiment of the present invention, a PV power system includes a plurality of PV arrays each configured to generate a direct current (DC) output from received solar irradiation and a DC-to-AC power inverter electrically coupled to the plurality of PV arrays to receive the DC output therefrom and invert the DC output to an AC output, the DC-to-AC power inverter including a DC link that receives the DC output from the plurality of PV arrays. The PV power system also includes a contactor arrangement positioned between the plurality of PV arrays and the DC-to-AC power inverter, the contactor arrangement including a plurality of contactors that are switchable between an on state and an off state to selectively connect the plurality of PV arrays to the DC-to-AC power inverter in a specified arrangement, so as to control a level of DC voltage received by the DC-to-AC power inverter from the plurality of PV arrays.

According to another embodiment of the present invention, a method for controlling the DC voltage provided to a photovoltaic (PV) inverter from a plurality of PV arrays is provided. The method includes the steps of measuring a DC voltage on a DC link of the PV inverter or from each of a plurality of PV arrays, comparing the DC voltage to one or more voltage thresholds of the PV inverter, and controlling an operating state of each of a plurality of contactors in a contactor arrangement based on the comparison of the DC voltage to the one or more voltage thresholds of the PV inverter, with the contactor arrangement being connected between the PV inverter and the plurality of PV arrays to control a level of DC voltage received by the PV inverter from the plurality of PV arrays. In controlling the operating state of each of a plurality of contactors, the method further includes the steps of operating each of the plurality of contactors in an on state or an off state so as to selectively connect the plurality of PV arrays to the PV inverter in a determined arrangement, the determined arrangement comprising a determined number of PV arrays in a series arrangement and a determined number of PV arrays in a parallel arrangement.

According to yet another embodiment of the present invention, a PV power system includes a plurality of PV arrays each configured to generate a DC output from received solar irradiation and a PV inverter electrically coupled to the plurality of PV arrays to receive the DC output therefrom and invert the DC output to an AC output usable by a load connected to the PV inverter, with the PV inverter including a DC link that operates at a variable DC link voltage that is determined by the PV inverter according to a global maximum power point tracking (MPPT) algorithm. The PV power system also includes a contactor arrangement positioned between the plurality of PV arrays and the PV power inverter that includes a plurality of contactors that are switchable between an on state and an off state to selectively connect the plurality of PV arrays to the DC link and so as to control a level of DC voltage received by the PV inverter from the plurality of PV arrays. The PV power system further includes a controller in operable connection with the contactor arrangement, the controller being programmed to control operation of the contactor arrangement so as to cause the DC output provided from the plurality of PV arrays to the PV inverter to exceed a minimum PV inverter operation voltage value.

The present invention has been described in terms of the preferred embodiment, and it is recognized that equivalents, alternatives, and modifications, aside from those expressly stated, are possible and within the scope of the appending claims.

What is claimed is:

1. A photovoltaic (PV) power system comprising:
a plurality of PV arrays each configured to generate a direct current (DC) output from received solar irradiation;
a DC-to-AC power inverter electrically coupled to the plurality of PV arrays to receive the DC output therefrom and invert the DC output to an AC output, the DC-to-AC power inverter including a DC link that receives the DC output from the plurality of PV arrays; a contactor arrangement positioned between the plurality of PV arrays and the DC-to-AC power inverter, the contactor arrangement including a plurality of contactors that are switchable between an on state and an off state to selectively connect the plurality of PV arrays to the DC-to-AC power inverter in a specified arrangement, so as to control a level of DC voltage received by the DC-to-AC power inverter from the plurality of PV arrays;
a controller configured to control switching of the plurality of contactors between the on state and the off state for connecting the plurality of PV arrays to the DC-to-AC power inverter in the specified arrangement; and
an arrangement of secondary contactors and resistors configured to load the plurality of PV arrays when the plurality of contactors are switched between the on state and the off state, so as to reduce a level of voltage on the DC link;
wherein the controller is further configured to switch the secondary contactors when the plurality of contactors are switched between the on state and the off state to reduce the level of voltage on the DC link.

2. The PV power system of claim 1 wherein the controller is configured to operate the DC-to-AC power inverter within a pre-determined voltage operating window, between a minimum DC link voltage and a maximum DC link voltage.

3. The PV power system of claim 2 wherein the controller is configured to:

measure the DC voltage output from the plurality of PV arrays;
compare the DC voltage output from the plurality of PV arrays to the voltage operating window; and
selectively operate each of the plurality of contactors in one of the on state and the off state to connect the plurality of PV arrays in a specified arrangement based on the comparison of the measured DC voltage output to the voltage operating window, such that the DC voltage output from the plurality of PV arrays falls within the voltage operating window;
wherein the plurality of PV arrays continue to operate at their maximum power point voltage when connected in the specified arrangement.

4. The PV power system of claim 3 wherein a range of DC voltages for the maximum power point voltage of the PV arrays is predefined, and wherein the controller is configured to selectively operate each of the plurality of contactors to connect the plurality of PV arrays in the specified arrangement based on observed voltages and powers for a given PV array size.

5. The PV power system of claim 3 wherein the controller is configured to:
determine if the measured DC voltage output from the plurality of PV arrays is less than a minimum safe or rated DC link voltage; and
if the measured DC voltage output from the plurality of PV arrays is less than the minimum safe or rated DC link voltage, then selectively operate each of the plurality of contactors in one of the on state and the off state to connect at least a portion of the plurality of PV arrays in a series arrangement;
otherwise, if the measured DC voltage output from the plurality of PV arrays is greater than the minimum safe or rated DC link voltage, then selectively operate each of the plurality of contactors in one of the on state and the off state to connect at least a portion of the plurality of PV arrays in a parallel arrangement.

6. The PV power system of claim 2 wherein the controller is configured to control switching of the plurality of contactors between the on state and the off state while the DC-to-AC power inverter is online or while the DC-to-AC power inverter is at zero current.

7. The PV power system of claim 6 further comprising a start-up circuit configured to maintain the DC link voltage below the maximum DC link voltage when the plurality of contactors are switched between the on state and the off state while the DC-to-AC power inverter is at zero current.

8. The PV power system of claim 7 wherein the start-up circuit comprises one of a contactor based circuit that provides a fixed load to the PV arrays or a DC-DC converter based circuit where the load on the PV arrays is controlled based on the voltage requirements.

9. The PV power system of claim 1 further comprising a partial rating DC-DC converter configured to modify the DC output from at least one of the plurality of PV arrays, with the modified DC output from the at least one of the plurality of PV arrays being provided to the DC link.

10. The PV power system of claim 9 wherein the partial rating DC-DC converter comprises a partial rating DC-DC converter configured to step-up the DC output from at least one of the plurality of PV arrays.

11. The PV power system of claim 10 wherein each of the plurality of contactors are selectively operated in the on state or the off state to connect a specified number of the plurality of PV arrays to the DC-to-AC power inverter in a series arrangement and connect a remaining number of the plurality of PV arrays to the partial rating DC-DC to step-up the DC output therefrom.

12. The PV power system of claim 9 wherein the partial rating DC-DC converter comprises a partial rating DC-DC converter configured to step-down the DC output from at least one of the plurality of PV arrays to output a buck voltage.

13. The PV power system of claim 12 wherein each of the plurality of contactors are selectively operated in the on state or the off state to connect the DC output from at least one of the plurality of PV arrays in series with the buck voltage output by the partial rating DC-DC converter.

14. The PV power system of claim 1 wherein the DC-to-AC power inverter is configured to vary the DC link voltage to match the PV array voltage at startup of the PV power system.

15. A photovoltaic (PV) power system comprising:
a plurality of PV arrays each configured to generate a direct current (DC) output from received solar irradiation;
a PV inverter electrically coupled to the plurality of PV arrays to receive the DC output therefrom and invert the DC output to an AC output usable by a load connected to the PV inverter, the PV inverter including a DC link that operates at a variable DC link voltage that is determined by the PV inverter according to a global maximum power point tracking (MPPT) algorithm;
a contactor arrangement positioned between the plurality of PV arrays and the PV power inverter and including a plurality of contactors that are switchable between an on state and an off state to selectively connect the plurality of PV arrays to the DC link and so as to control a level of DC voltage received by the PV inverter from the plurality of PV arrays;
a controller in operable connection with the contactor arrangement, the controller being programmed to control operation of the contactor arrangement so as to cause the DC output provided from the plurality of PV arrays to the PV inverter to exceed a minimum PV inverter operation voltage value; and
an arrangement of secondary contactors and resistors configured to load the plurality of PV arrays when the plurality of contactors are switched between the on state and the off state, so as to reduce a level of voltage on the DC link;
wherein the controller is further configured to switch the secondary contactors when the plurality of contactors are switched between the on state and the off state to reduce the level of voltage on the DC link.

16. The PV power system of claim 15 wherein the controller is configured to:
measure the DC voltage output from the plurality of PV arrays;
compare the DC voltage output from the plurality of PV arrays to the minimum PV inverter operation voltage value;
determine a switching strategy for operating each of the plurality of contactors in one of the on state and the off state that causes the DC voltage provided from the plurality of PV arrays to the DC link to exceed the minimum PV inverter operation voltage value; and
operate each of the plurality of contactors in one of the on state and the off state according to the switching strategy.

17. The PV power system of claim 15 wherein the plurality of contactors are switchable between the on state and the off state to selectively connect the plurality of PV arrays to the DC link in a series arrangement, a parallel arrangement, or a combination of series and parallel arrangements.

18. The PV power system of claim 15 further comprising a partial rating DC-DC converter connected to one of the plurality of PV arrays, the partial rating DC-DC converter configured to modify the DC output from at least one of the plurality of PV arrays, with the modified DC output from the at least one of the plurality of PV arrays being provided to the DC link.

19. The PV power system of claim 18 wherein the partial rating DC-DC converter comprises one of a boost converter and a buck converter.

20. The PV power system of claim 18 wherein the contactor arrangement and the partial rating DC-DC converter are included in one of a combiner box, a re-combiner box, and the PV inverter.

* * * * *